(12) United States Patent
Saby et al.

(10) Patent No.: US 9,793,737 B2
(45) Date of Patent: Oct. 17, 2017

(54) ELECTRONIC DEVICE INCLUDING A VERY LOW VOLTAGE GENERATOR POWERING A BATTERY

(71) Applicant: EM Microelectronic-Marin S.A., Marin (CH)

(72) Inventors: Jérôme Saby, Neuchâtel (CH); Yves Theoduloz, Yverdon (CH); Cyril Marti, Lignières (CH)

(73) Assignee: EM Microelectronic-Marin S.A., Marin (CH)

( * ) Notice: Subject to any disclaimer, the term of this patent is extended or adjusted under 35 U.S.C. 154(b) by 223 days.

(21) Appl. No.: 14/705,357

(22) Filed: May 6, 2015

(65) Prior Publication Data

US 2015/0340901 A1 Nov. 26, 2015

(30) Foreign Application Priority Data

May 26, 2014 (EP) .................................... 14169861

(51) Int. Cl.
*H02J 7/02* (2016.01)
*G01R 31/36* (2006.01)
(Continued)

(52) U.S. Cl.
CPC .......... *H02J 7/022* (2013.01); *G01R 31/3624* (2013.01); *G01R 31/3696* (2013.01);
(Continued)

(58) Field of Classification Search
CPC ............. C10J 2300/1284; F03D 9/007; H04Q 2209/886
(Continued)

(56) References Cited

U.S. PATENT DOCUMENTS

| 6,646,960 | B1* | 11/2003 | Nagata | G04G 19/00 320/101 |
| 8,704,494 | B2* | 4/2014 | LoCascio | H02J 7/0052 320/101 |
| 2014/0203735 | A1 | 7/2014 | Sugiyama et al. | |

FOREIGN PATENT DOCUMENTS

WO   2013/042166 A1   3/2013

OTHER PUBLICATIONS

Search Report issued in corresponding European application 14169861, completed Nov. 24, 2014.
(Continued)

*Primary Examiner* — Drew A Dunn
*Assistant Examiner* — Sailesh Thapa
(74) *Attorney, Agent, or Firm* — Oblon, McClelland, Maier & Neustadt, L.L.P.

(57) ABSTRACT

The electronic device includes a battery, an electrical energy generator and, between the generator and the battery, an inductive voltage boost converter. The device further includes a circuit for measuring the voltage supplied by the generator which is formed by: a measuring capacitor arranged in parallel with the battery and having a measuring terminal connected to a voltage measuring circuit, a diode located between the inductor output terminal and the measuring terminal, a switch arranged between the measuring terminal and the earth terminal. A control unit is arranged to periodically activate a mode for measuring a voltage at the measuring terminal. The measuring capacitor is selected such that the measuring voltage is much higher than the generator voltage and lower than the battery voltage at a minimum generator voltage allowing charging of the battery.

11 Claims, 1 Drawing Sheet

(51) Int. Cl.
*H02J 7/04* (2006.01)
*H02J 3/38* (2006.01)
*H02M 3/158* (2006.01)
*G01R 31/40* (2014.01)
*G01R 15/16* (2006.01)
*H02J 7/32* (2006.01)

(52) U.S. Cl.
CPC ............ *H02J 3/382* (2013.01); *H02J 7/045* (2013.01); *H02M 3/158* (2013.01); *G01R 15/16* (2013.01); *G01R 31/40* (2013.01); *H02J 7/32* (2013.01); *Y02B 40/90* (2013.01)

(58) Field of Classification Search
USPC .......................................................... 320/101
See application file for complete search history.

(56) References Cited

OTHER PUBLICATIONS

Proynov P et al: "Switched-capacitor power sensing in low-power energy harvesting systems". Electronics Letters. IEE Stevenage. GB. vol. 49. No. 2. Jan. 17, 2013 (Jan. 17, 2013). pp. 151-152.
Xinping Cao et al: "Electromagnetic Energy Harvesting Circuit With Feedforward and Feedback DCA DC PWM Boost Converter for Vibration Power Generator System" IEEE Transactions on Power Electronics, Institute of Electrical and Electronics Engineers, USA, vol. 22, No. 2, Mar. 22, 2007 (Mar. 22, 2007), pp. 679-685.
Jungmoon Kim et al: "A DC DC Boost Converter with variation-Tolerant MPPT Technique and Efficient ZCS Circuit for Thennoelectric Energy Harvesting Applications", IEEE Transactions on Power Electronics, Institute of Electrical and Electronics Engineers, USA, vol. 28, No. 8, Aug. 28, 2013 (Aug. 28, 2013), pp. 3827-3833.

* cited by examiner

ELECTRONIC DEVICE INCLUDING A VERY LOW VOLTAGE GENERATOR POWERING A BATTERY

This application claims priority from European patent application No. 14169861.3 filed May 26, 2014, the entire disclosure of which is hereby incorporated herein by reference.

FIELD OF THE INVENTION

The present invention concerns the field of electronic devices including a battery and a very low voltage electric generator arranged for charging the battery by means of a DC/DC converter defining a voltage booster. In particular, the generator is a thermoelectric generator which captures thermal energy from its environment. For example, the electronic device is a watch worn on the user's wrist.

BACKGROUND OF THE INVENTION

There are known thermoelectric generators (TEG) which are capable of providing low voltage electrical energy, on the order of several millivolts, for charging a battery of a portable electronic device by means of an inductive voltage boost converter. An electrical diagram of such a device is partially shown in FIG. 1.

Electronic device 2 includes a thermoelectric generator 4, represented by a voltage source $V_{TEG}$ and an internal voltage $R_{TEG}$, a battery 6 and a voltage booster 8. This voltage booster is formed by a buffer capacitor C0 at input, an inductor L and an integrated circuit 10 arranged between the inductor output terminal $V_{LX}$ and the positive battery terminal $V_{BAT}$. It will be noted that the buffer capacitor and the inductor are discrete elements. The integrated circuit includes a diode D1 or a plurality of diodes D1, D2 arranged in parallel between terminal $V_{LX}$ and the positive battery terminal, a smoothing capacitor C1 and a switch TM formed by an MOS transistor. This switch receives a control signal S1 from a control unit (not shown) to control its actuation. When generator 4 supplies sufficient energy, the battery is charged by periodically switching switch TM between its closed position (transistor is conductive) and its open position (transistor is non-conductive).

For thermoelectric generators which capture thermal energy from their environment in the presence of a small temperature difference, the voltage supplied varies with this temperature difference so that the voltage can drop below a minimum value at which the battery charging system output becomes zero. Thus, below this minimum value, the voltage booster must be deactivated to avoid discharging the battery. In order to do this, it is necessary to measure periodically the voltage at the voltage booster input. This poses a technical problem when the voltage $V_{in}$ supplied by the thermoelectric generator in normal operation is very low, on the order of several millivolts (mV), and when said minimum value is, for example, approximately equal to 1 mV. This situation occurs, for example, with a watch worn on a user's wrist incorporating a conventional thermoelectric generator which provides a voltage of between 5 mV and 10 mV per degree (5-10 mV/K). The usable temperature difference is on the order of one Kelvin when the watch is worn on the user's wrist. However, when the watch is removed from the user's wrist and stored, for example, in a box, the voltage supplied becomes zero and it is essential to deactivate the energy collection system which uses energy and thus discharges the battery.

The technical problem arises from the difficulty in measuring such small voltages or corresponding small currents. Indeed, the prior art electronic circuits for measuring such small voltages are complex and sensitive, and therefore expensive and difficult to implement.

SUMMARY OF THE INVENTION

It is an object of the present invention to provide a solution to the aforementioned problem by proposing circuit for measuring a low voltage supplied by an electrical energy generator, associated with an inductive voltage booster, which is simple and inexpensive, yet allows sufficiently precise measurement of this low voltage at least within a useful voltage range.

To this end, the present invention concerns an electronic device of the type previously described and characterized in that it includes a circuit for measuring the voltage of the electrical energy generator, the circuit being formed by:
  a measuring capacitor arranged in parallel with the battery between the earth terminal and the output terminal of the inductor, this measuring capacitor being smaller than the battery capacitor and having a measuring terminal connected to the voltage measuring circuit;
  a diode located between the inductor output terminal and the measuring terminal of the measuring capacitor; and
  a switch for discharging the measuring capacitor which is arranged between the measuring terminal and the earth terminal and controlled by a control unit.

The control unit is arranged to periodically activate a mode for measuring the voltage at the measuring terminal wherein the control unit closes the discharge switch for a first time interval, so as to empty the measuring capacitor, and closes the voltage booster switch for a second time interval so as to establish a measuring current in its inductor. The end of the first time interval is arranged to occur before or simultaneously with the end of the second time interval, so that the energy accumulated in the inductor is partially transferred into the measuring capacitor after the second time interval and therefore generates, at the measuring terminal, at the end of the energy transfer, a voltage representative of the generator voltage as long as such voltage is lower than the battery voltage. The measuring capacitor is selected such that the measuring voltage is higher than the generator voltage and lower than the battery voltage at a minimum generator voltage allowing charging of the battery.

In particular, the generator is a thermoelectric generator and the electronic device is a portable object worn on a user's wrist, this thermoelectric generator capturing the energy produced by the user's body.

Other particular features of the invention will be set out below in the detailed description of the invention.

BRIEF DESCRIPTION OF THE DRAWINGS

The invention will be described below with reference to the annexed drawings, given by way of non-limiting example, and in which.

DETAILED DESCRIPTION OF THE INVENTION

Figure 1:
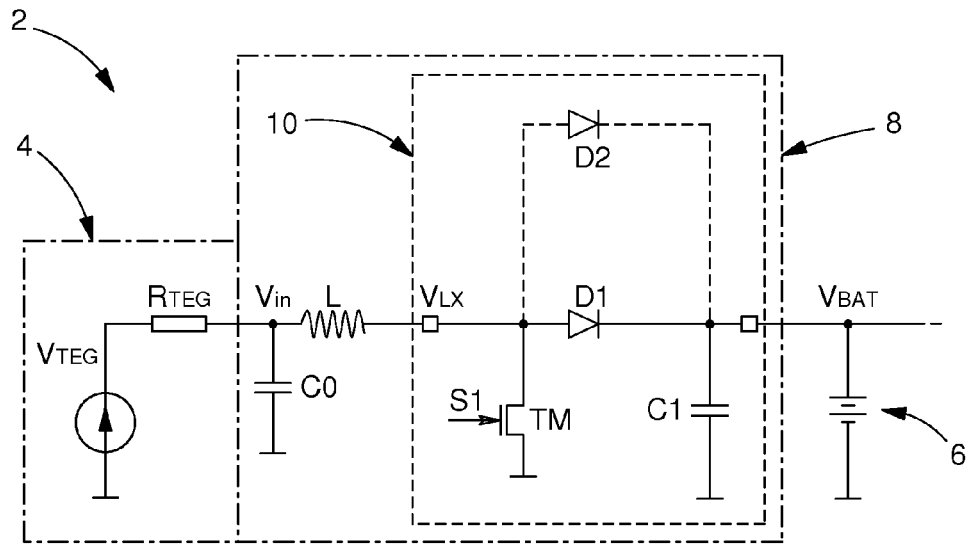
FIG. 1, already described, is the electrical diagram of a prior art electronic device for charging a battery with the aid of a thermoelectric generator supplying a low voltage.
Figure 2:
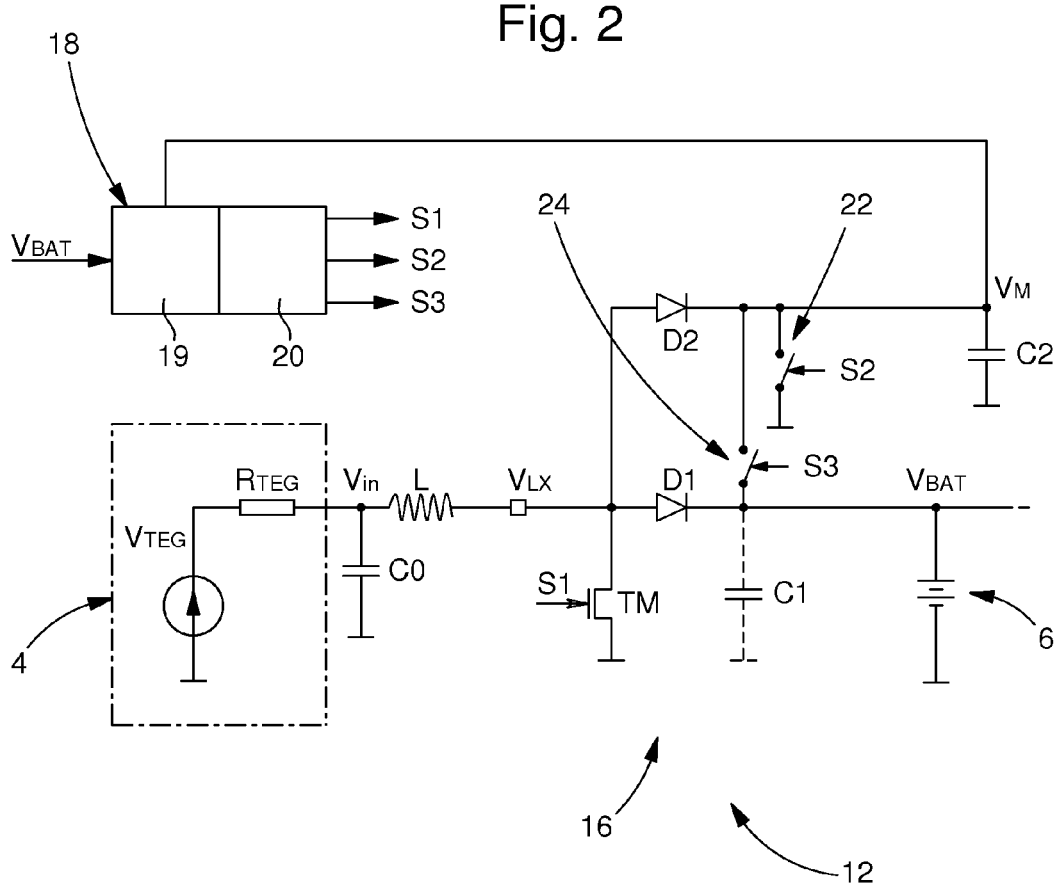
FIG. 2 is an electrical diagram of one embodiment of an electronic device of the present invention.

Electronic device 12 shown in FIG. 2 includes a battery 6, an electrical energy generator 4 and, between the generator and the battery, an inductive voltage boost converter 16. The generator is capable of supplying at the voltage boost converter input a voltage $V_{in}$ which is lower than a voltage $V_{BAT}$ delivered by the battery.

Voltage boost converter 16 includes:
- an inductor L whose input terminal is connected to generator 4,
- at least a first diode D1 arranged between the inductor output terminal $V_{LX}$ and the energy supply terminal of battery 6,
- a first switch TM arranged between the inductor output terminal and an earth terminal, and
- a control unit 20 which controls the first switch by supplying it with a control signal S1.

Moreover, according to the invention, electronic device 12 further includes a circuit for measuring the voltage $V_{in}$ supplied by the generator. This measuring circuit is formed by:
- a measuring capacitor C2 arranged in parallel with the battery between an earth terminal and the inductor output terminal, this measuring capacitor being smaller than the battery capacitor and having a measuring terminal connected to a circuit 19 for measuring the voltage at the measuring terminal;
- a second diode D2 located between the inductor output terminal $V_{LX}$ and the measuring terminal of the measuring capacitor; and
- a second switch 22 arranged between the measuring terminal and an earth terminal and controlled by control unit 20 which supplies it with a control signal S2.

Measuring circuit 19 and control unit 20 form together a circuit 18 for managing the charging of battery 6 by generator 4. In the embodiment described here, the generator is a thermoelectric generator. Management circuit 18 is arranged to periodically activate a mode for measuring voltage $V_M$, at the measuring terminal of capacitor C2, in which control unit 20 closes second switch 22 for a first time interval, so as to empty capacitor C2, and closes first switch TM for a second time interval so as to establish a measuring current in the inductor. The end of the first time interval occurs before or simultaneously with the end of the second time interval so that the energy accumulated in the inductor is partially transferred into measuring capacitor C2 after the second time interval and thus generates, at the measuring terminal of the capacitor, at the end of the energy transfer, a voltage $V_M$ representative of voltage $V_{in}$ provided that this voltage $V_M$ is lower than the battery voltage $V_{BAT}$. The measuring capacitor is selected such that voltage $V_M$ is higher than voltage $V_{in}$ and lower than the battery voltage at least at a minimum voltage of generator 4 allowing charging of the battery.

In a main variant, voltage $V_{in}$ supplied by generator 4 is very low, less than 100 mV. For example, the voltage supplied by a thermoelectric generator in a portable device is around 5 mV. The battery is arranged to supply a voltage on the order of one volt, for example 1.5 V.

The energy accumulated in an inductor L traversed by a current $I_L$ is equal to $$E_L = \frac{1}{2} L \cdot I_L^2$$

This energy is transferred to measuring capacitor C2 (the value of this capacitor is equal to C) with a loss equal to half through energy dissipation. The energy stored in capacitor C2 and the energy dissipated during the transfer between the inductor and this capacitor is equal to $$E_C = C(V\text{in})^2$$

In a preferred variant, as shown in FIG. 2, electronic device 12 includes a buffer capacitor C0 arranged between the inductor input terminal and the earth terminal. In the mode for measuring $V_{in}$, control unit 20 holds first switch TM open for a third time interval $T_{init}$ that precedes said second time interval and whose duration is arranged to be sufficiently long for voltage $V_{in}$ at the inductor input terminal to have a value at least equal to 90% of internal voltage $V_{TEG}$ of generator 4. In the negative case where C0 is initially empty, the charging of C0 at least 90% is obtained where $T_{INIT} = 3 \cdot R_{TEG} \cdot C0$.

In a preferred variant, buffer capacitor C0 maintains an approximately constant voltage at the inductor input terminal throughout the second time interval during which the first switch is closed to establish a current in the inductor, this current depending linearly on the voltage $V_{TEG}$ generated by the thermoelectric generator. In particular, the second interval $T_{TM}$ and buffer capacitor C0 are selected such that the voltage $V_{in}$ at the inductor input terminal decreases by no more than 10% during the second interval. By way of example, $V_{TEG}=1$ mV, C0=10 μF, L=100 pH and $T_{TM}=100$ μs.

The conditions of the aforementioned preferred variants make it possible to approximate the value of voltage $V_M$ of measuring capacitor C2 by a mathematical relation corresponding to the ideal case where $V_{in}=V_{TEG}$ throughout the second time interval $T_{TM}$ where first switch TM is closed (i.e. conductive) in the measuring mode. In this ideal case, the current $I_L$ flowing in inductor L is provided by the following formula:

$$I_L = (V_{TEG} \times T_{TM})/L$$

By making energy $E_L$ equal to energy $E_C$ in the two aforecited equalities, a theoretical value is obtained for $V_M$ given by the following equality:

$$V_M = (V_{TEG} \times T_{TM})/\sqrt{2LC}$$

In an example embodiment where $V_{TEG}=1$ mV, L=100 pH and $T_{TM}=100$ μs as mentioned above and C=100 pF, a value substantially equal to 700 mV (0.7V) is obtained for $V_M$. It will be noted that, if the battery voltage is equal, for example, to 1.5 V, it will no longer be possible to measure voltage $V_{TEG}$ correctly once this voltage exceeds substantially 2 mV. Thus, the measuring circuit according to the invention is of limited application, but is specific to the intended application of the measuring circuit, namely of determining whether the generator is generating a sufficient minimum voltage to charge the battery, i.e. with a positive energy balance. It is therefore clear that, in normal operation, the generator can supply a higher voltage, for example a voltage in the range of 5-10 mV. Within this range, the measuring circuit does not allow the generator voltage to be measured. However, it can detect whether this voltage is higher than a certain value, 2 mV here, when the generator is operating within said range. If the minimum voltage for $V_{TEG}$ is equal here, for example, to 1 mV, the corresponding measuring voltage remains below 1 V, but above 0.5 V. It is easy for measuring circuit 19 to measure such a voltage using a simple, inexpensive circuit, particularly since it does not need to be very precise. Preferably, the inductor, the measuring capacitor and the duration of the second time interval $T_{TM}$ are selected such that measuring voltage $V_M$ is at least one hundred times higher than the voltage supplied by the generator.

According to a particular variant, the threshold voltage of second diode D2 is higher than voltage $V_{TEG}$ supplied by the generator. For example, this threshold voltage is equal to 200 mV. This feature makes it possible to prevent capacitor C0 from charging capacitor C2 at an initial voltage substantially equal to $V_{TEG}$ during measurement of this voltage. It will be noted, however, that such an initial voltage would cause virtually no disruption to the measurement given the low value of $V_{TEG}$ and given that the charge of C2 would have virtually no effect on the charge of buffer capacitor C0.

According to a particular variant, a third switch 24 is arranged between the measuring terminal and the battery power supply terminal. This third switch is also controlled by control unit 20 which sends it a control signal S3. The control unit is arranged to close the third switch in a battery charging mode and to open it in the measuring mode. A first advantage of this variant arises from the fact that diode D2 forms a useful element of the battery charging circuit. In other words, this diode D2 is not an additional diode specific to the generator voltage measuring circuit; but has a first function in charging mode where it forms a battery charging path parallel to the path through the first diode D1; and has a second function in the measuring mode where it can initially discharge the measuring capacitor and then preserve the energy transferred from the inductor to the measuring capacitor. Moreover, the third switch, when closed (i.e. conductive), can use capacitor C2 as a smoothing capacitor for charging the battery. Thus, smoothing capacitor C1 is optional in some embodiments, as shown in FIG. 2.

What is claimed is:

1. An electronic device comprising:
    a battery,
    an electrical energy generator, and
    between the generator and the battery, an inductive voltage boost converter, said generator being configured to supply a first voltage lower than a second voltage supplied by the battery, said converter including:
        an inductor whose input terminal is connected to the generator,
        at least a first diode arranged between an inductor output terminal and a battery power supply terminal,
        a first switch arranged between the inductor output terminal and an earth terminal, and
        a controller configured to control the first switch;
    wherein
    said electronic device further includes a circuit to measure said first voltage, which includes:
        a measuring capacitor arranged in parallel with the battery between the earth terminal and the inductor output terminal, said measuring capacitor being smaller than a battery capacitor and having a measuring terminal connected to the voltage measuring circuit;
        a second diode located between the inductor output terminal and the measuring terminal of the measuring capacitor; and
        a second switch arranged between said measuring terminal and the earth terminal and controlled by the controller;
    the controller being configured to periodically activate a mode for measuring a measuring voltage at said measuring terminal wherein said controller closes the second switch for a first time interval, so as to empty the measuring capacitor, and closes the first switch for a second time interval so as to establish a measuring current in the inductor, an end of the first time interval occurring before or simultaneously with an end of the second time interval so that energy accumulated in the inductor is partially transferred into the measuring capacitor after the second time interval and thus generates, at said measuring terminal, at an end of the energy transfer, a voltage representative of said first voltage as long as said voltage is less than the second voltage, the measuring capacitor being selected so that the measuring voltage is higher than the first voltage and lower than the second voltage at a minimum voltage of said generator allowing charging of the battery.

2. The electronic device according to claim 1, wherein the device further comprises a buffer capacitor arranged between the inductor input terminal and the earth terminal; and wherein
    said controller, in said measuring mode, keeps the first switch open during a third time interval preceding said second time interval, a duration of the third time interval being arranged to be sufficiently long for a voltage at the inductor input terminal to have a value at least equal to 90% of the first voltage supplied by the generator.

3. The electronic device according to claim 2, wherein a duration of the second interval and said buffer capacitor are selected such that the voltage at said input terminal decreases by no more than 10% during said second interval.

4. The electronic device according to claim 1, wherein a threshold voltage of the second diode is higher than the first voltage supplied by the generator.

5. The electronic device according to claim 1, wherein a third switch is arranged between said measuring terminal and the battery power supply terminal, said third switch also being controlled by the controller, said controller being configured to close said third switch in a battery charging mode and to open said third switch in said measuring mode.

6. The electronic device according to claim 1, wherein the inductor, the measuring capacitor, and a duration of the second time interval are selected such that the measuring voltage is, at least for said minimum voltage, at least one hundred times higher than the first voltage supplied by the generator.

7. The electronic device according to claim 1, wherein said generator is a thermoelectric generator and said electronic device is a portable object worn on a user's wrist, said thermoelectric generator capturing energy produced by the user's body.

8. The electronic device according to claim 1, wherein said electronic device is a watch.

9. The electronic device according to claim 1, wherein the first voltage supplied by the generator is less than 100 mV.

10. The electronic device according to claim 1, wherein the buffer capacitor maintains an approximately constant voltage at the inductor input terminal throughout the second time interval during which the first switch is closed to establish the current in the inductor.

11. The electronic device according to claim 1, wherein the measuring circuit does not allow the first voltage supplied by the generator to be measured when the first voltage exceeds a predetermined voltage.

* * * * *

UNITED STATES PATENT AND TRADEMARK OFFICE
CERTIFICATE OF CORRECTION

| | |
|---|---|
| PATENT NO. | : 9,793,737 B2 |
| APPLICATION NO. | : 14/705357 |
| DATED | : October 17, 2017 |
| INVENTOR(S) | : Jerome Saby et al. |

It is certified that error appears in the above-identified patent and that said Letters Patent is hereby corrected as shown below:

In the Specification

Column 4, Line 25, change "L=100 pH" to --L = 100 µH--.

Column 4, Line 41, change "L=100 pH" to --L = 100 µH--.

Signed and Sealed this
Fourteenth Day of August, 2018

Andrei Iancu
*Director of the United States Patent and Trademark Office*